(12) United States Patent
Bhavnagarwala et al.

(10) Patent No.: US 10,276,238 B2
(45) Date of Patent: *Apr. 30, 2019

(54) METHOD, SYSTEM AND DEVICE FOR COMPLEMENTARY NON-VOLATILE MEMORY DEVICE OPERATION

(71) Applicant: ARM Ltd., Cambridge (GB)

(72) Inventors: Azeez Bhavnagarwala, Newtown, CT (US); Robert Campbell Aitken, San Jose, CA (US)

(73) Assignee: ARM Ltd., Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/989,879

(22) Filed: May 25, 2018

(65) Prior Publication Data

US 2018/0277211 A1  Sep. 27, 2018

Related U.S. Application Data

(63) Continuation of application No. 15/387,061, filed on Dec. 21, 2016, now Pat. No. 10,008,263, which is a
(Continued)

(51) Int. Cl.
*G11C 11/00* (2006.01)
*G11C 13/00* (2006.01)

(52) U.S. Cl.
CPC ...... *G11C 13/0069* (2013.01); *G11C 13/0002* (2013.01); *G11C 13/003* (2013.01);
(Continued)

(58) Field of Classification Search
CPC ............ H01L 27/2463; H01L 45/1253; H01L 45/1608; H01L 27/2472; H01L 45/065; H01L 45/1226; H01L 29/1604; H01L 29/7881; G11C 3/0069; G11C 3/0007; G11C 3/0004; G11C 1/1675; G11C 3/0002; G11C 3/0011; G11C 6/10; G11C 2013/0071; G11C 1/16; G11C 4/009

See application file for complete search history.

(56) References Cited

U.S. PATENT DOCUMENTS 7,298,640 B2   11/2007   Chen et al.
7,639,523 B2   12/2009   Celinska et al.
(Continued)

FOREIGN PATENT DOCUMENTS

WO   2008058264 A2   5/2008
WO   2014158149 A1   10/2014

OTHER PUBLICATIONS

Application as Filed, Filed Sep. 22, 2015, U.S. Appl. No. 14/862,040, 45 pgs.
(Continued)

*Primary Examiner* — Uyen B Tran
(74) *Attorney, Agent, or Firm* — Berkeley Law & Technology Group, LLP

(57) ABSTRACT

Disclosed are methods, systems and devices for operation of dual non-volatile memory devices. In one aspect, a pair of non-volatile memory device coupled in series may be placed in complementary memory states any one of multiple memory states in write cycles by controlling a current and a voltage applied to terminals of the non-volatile memory device.

19 Claims, 4 Drawing Sheets

Related U.S. Application Data continuation of application No. 14/862,023, filed on Sep. 22, 2015, now Pat. No. 9,548,118.

(52) U.S. Cl.
CPC ........ *G11C 13/004* (2013.01); *G11C 13/0007* (2013.01); *G11C 13/0061* (2013.01); *G11C 13/0097* (2013.01); *G11C 11/00* (2013.01); *G11C 2213/75* (2013.01)

(56) References Cited

U.S. PATENT DOCUMENTS

| | | | |
|---|---|---|---|
| 7,778,063 | B2 | 8/2010 | Brubaker et al. |
| 7,872,900 | B2 | 1/2011 | Paz De Araujo et al. |
| 8,456,892 | B2 | 6/2013 | Yasuda |
| 8,674,724 | B2 | 3/2014 | Nazarian |
| 8,754,671 | B2 | 6/2014 | Nazarian |
| 9,191,000 | B2 | 11/2015 | Nazarian et al. |
| 9,230,641 | B2 | 1/2016 | Sekar |
| 9,318,158 | B2 | 4/2016 | Baker |
| 9,548,118 | B1 * | 1/2017 | Bhavnagarwala ............ G11C 13/0069 |
| 9,589,636 | B1 | 3/2017 | Bhavnagarwala |
| 10,008,263 | B2 * | 6/2018 | Bhavnagarwala ............ G11C 13/0069 |
| 2008/0107801 | A1 | 5/2008 | Celinska et al. |
| 2009/0316471 | A1 | 12/2009 | Tsuchida |
| 2012/0075910 | A1 | 3/2012 | Yasuda |
| 2012/0243297 | A1 | 9/2012 | Katayama et al. |
| 2013/0027081 | A1 | 1/2013 | Nazarian |
| 2013/0285699 | A1 | 10/2013 | McWilliams et al. |
| 2014/0269006 | A1 | 9/2014 | Sekar |
| 2015/0138877 | A1 * | 5/2015 | Nebashi ............ H03K 19/18 365/158 |
| 2015/0248936 | A1 | 9/2015 | Best et al. |
| 2015/0348595 | A1 | 12/2015 | Baker |
| 2016/0055906 | A1 | 2/2016 | Ho |

OTHER PUBLICATIONS

Non-Final Office Action, dated Apr. 12, 2016, U.S. Appl. No. 14/862,040, 13 pgs.
Response to Non-Final Office Action, filed Sep. 9, 2016, U.S. Appl. No. 14/862,040, 15 pgs.
Notice of Allowance, dated Nov. 3, 2016, U.S. Appl. No. 14/862,040, 7 pgs.
Issue Fee Payment, filed Jan. 26, 2017, U.S. Appl. No. 14/862,040, 3 pgs.
International Search Report, dated Dec. 14, 2016, International Application No. PCT/GB2016/052941, 5 pgs.
Written Opinion of the International Searching Authority, dated Dec. 14, 2106, International Application No. PCT/GB2016/052941, 8 pgs.
Wen Chao Shen et al, Memristor Logic Operation Gate with Share Contact RRAM Cell, vol. 32, No. 12, Oct. 13, 2011, IEEE Service Ctr., NY, NY, pp. 1650-1652.
International Search Report, dated Dec. 7, 2016, International Application No. PCT/GB2016/052942, 5 pgs.
Written Opinion of the International Searching Authority, dated Dec. 7, 2016, International Application No. PCT/GB2016/052942, 9 pgs.
Application as Filed, Filed Jan. 26, 2017, U.S. Appl. No. 15/416,799, 57 pgs.
Non-Final Office Action, dated Jun. 1, 2017, U.S. Appl. No. 15/416,799, 16 pgs.
Response to Non-Final Office Action, filed Aug. 28, 2017, U.S. Appl. No. 15/416,799, 24 pgs.
ETerminal Disclaimer, filed Aug. 28, 2017, U.S. Appl. No. 15/416,799, 3 pgs.
Final Office Action, dated Nov. 6, 2017, U.S. Appl. No. 15/416,799, 8 pgs.
Request for Continued Examination, filed Feb. 1, 2018, U.S. Appl. No. 15/416,799, 3 pgs.
Notice of Allowance, dated Mar. 23, 2018, U.S. Appl. No. 15/416,799, 10 pgs.
Rule 312 Amendment, filed Jun. 22, 2018, U.S. Appl. No. 15/416,799, 12 pgs.
Issue Fee Payment, filed Jun. 22, 2018, U.S. Appl. No. 15/416,799, 3 pgs.
Issue Notification, dated Jul. 25, 2018, U.S. Appl. No. 15/416,799, 1 pg.
Application as Filed, filed Jun. 25, 2018, U.S. Appl. No. 16/017,755, 59 pgs.
Application as Filed, filed Sep. 22, 2015, U.S. Appl. No. 14/862,023, 48 pgs.
Non-Final Office Action, dated Apr. 20, 2016, U.S. Appl. No. 14/862,023, 15 pgs.
Response to Non-Final Office Action, filed Jul. 14, 2016, U.S. Appl. No. 14/862,023, 18 pgs.
Notice of Allowance, dated Sep. 9, 2016, U.S. Appl. No. 14/862,023, 15 pgs.
Issue Fee Payment, filed Dec. 7, 2016, U.S. Appl. No. 14/862,023, 3 pgs.
Issue Notification, dated Dec. 26, 2016, U.S. Appl. No. 14/862,023, 1 pg.
Application as Filed, filed Dec. 21, 2016, U.S. Appl. No. 15/387,061, 60 pgs.
Non-Final Office Action, dated Sep. 12, 2017, U.S. Appl. No. 15/387,061, 20 pgs.
Response to Non-Final Office Action, filed Dec. 7, 2017, U.S. Appl. No. 15/387,061, 21 pgs.
Notice of Allowance, dated Feb. 12, 2018, U.S. Appl. No. 15/387,061, 10 pgs.
Issue Fee Payment, filed May 1, 2018, U.S. Appl. No. 15/387,061, 9 pgs.
ETerminal Disclaimer, filed May 1, 2018, U.S. Appl. No. 15/387,061, 3 pgs.
Rule 312 Amendment, filed May 1, 2018, U.S. Appl. No. 15/387,061, 3 pgs.
Corrected Notice of Allowability, dated May 31, 2018, U.S. Appl. No. 15/387,061, 4 pgs.
Issue Notification, dated Jun. 6, 2018, U.S. Appl. No. 15/387,061, 1 pg.

* cited by examiner

METHOD, SYSTEM AND DEVICE FOR COMPLEMENTARY NON-VOLATILE MEMORY DEVICE OPERATION

CROSS REFERENCE TO RELATED APPLICATIONS

This application is related to U.S. patent application Ser. No. 14/862,040, titled "METHOD, SYSTEM AND DEVICE FOR COMPLEMENTARY NON-VOLATILE MEMORY DEVICE OPERATION," filed on Sep. 22, 2015 and issued as U.S. Pat. No. 9,589,636, and incorporated herein by reference in its entirety, and is a continuation of U.S. patent application Ser. No. 15/387,061, titled "METHOD, SYSTEM AND DEVICE FOR COMPLEMENTARY NON-VOLATILE MEMORY DEVICE OPERATION," filed on Dec. 21, 2016, which is a continuation of U.S. patent application Ser. No. 14/862,023, titled METHOD, SYSTEM AND DEVICE FOR COMPLEMENTARY NON-VOLATILE MEMORY DEVICE OPERATION, filed Sep. 22, 2015 and issued as U.S. Pat. No. 9,548,118, and is incorporated herein by reference in its entirety.

BACKGROUND

1. Field

Disclosed are techniques for utilizing memory devices.

2. Information

Non-volatile memories are a class of memory in which the memory cell or element does not lose its state after power supplied to the device is removed. The earliest computer memories, made with rings of ferrite that could be magnetized in two directions, were non-volatile, for example. As semiconductor technology evolved into higher levels of miniaturization, the ferrite devices were abandoned for the more commonly known volatile memories, such as DRAMs (Dynamic Random Access Memories) and SRAMs (Static-RAMs).

One type of non-volatile memory, electrically erasable programmable read-only memory (EEPROM) devices have large cell areas and may require a large voltage (e.g., from 12.0 to 21.0 volts) on a transistor gate to write or erase. Also, an erase or write time is typically of the order of tens of microseconds. One limiting factor with EEPROMs is the limited number of erase/write cycles to no more than slightly over 600,000—or of the order of $10^5$-$10^6$. The semiconductor industry has eliminated a need of a pass-gate switch transistor between EEPROMs and non-volatile transistors by sectorizing a memory array in such a way that "pages" (e.g., sub-arrays) may be erased at a time in EEPROMs called flash memory devices. In flash memory devices, an ability to keep random access (erase/write single bits) was sacrificed for speed and higher bit density.

More recently, FeRAMs (Ferroelectric RAMs) have provided low power, relatively high write/read speed, and endurance for read/write cycles exceeding 10 billion times. Similarly, magnetic memories (MRAMs) have provided high write/read speed and endurance, but with a high cost premium and higher power consumption. Neither of these technologies reaches the density of flash memory devices, for example. As such, flash remains a non-volatile memory of choice. Nevertheless, it is generally recognized that flash memory technology may not scale easily below 65 nanometers (nm); thus, new non-volatile memory devices capable of being scaled to smaller sizes are actively being sought.

Technologies considered for the replacement of flash memory devices have included memories based on certain materials that exhibit a resistance change associated with a change of phase of the material (determined, at least in part, by a long range ordering of atoms in the crystalline structure). In one type of variable resistance memory called a phase change memory (PCM/PCRAM) devices, a change in resistance occurs as the memory element is melted briefly and then cooled to either a conductive crystalline state or a non-conductive amorphous state. Typical materials vary and may include GeSbTe, where Sb and Te can be exchanged with other elements of the same or similar properties on the Periodic Table. However, these resistance-based memories have not proved to be commercially useful because their transition between the conductive and the insulating state depends on a physical structure phenomenon (e.g., melting at up to 600 degrees C.) and returning to a solid state that cannot be sufficiently controlled for a useful memory in many applications.

Another variable resistance memory category includes materials that respond to an initial high "forming" voltage and current to activate a variable resistance function. These materials may include, for example, $Pr_xCa_yMn_zO_\varepsilon$, with x, y, z and ε of varying stoichiometry; transition metal oxides, such as CuO, CoO, $VO_x$, NiO, $TiO_2$, $Ta_2O_5$; and some perovskites, such as Cr; $SrTiO_3$. Several of these memory types exist and fall into the resistive RAMs (ReRAMs) or conductive bridge RAMS (CBRAM) classification, to distinguish them from the chalcogenide type memories. It is postulated that resistance switching in these RAMs is due, at least in part, to the formation of narrow conducting paths or filaments connecting the top and bottom conductive terminals by the electroforming process, though the presence of such conducting filaments are still a matter of controversy. Since operation of a ReRAM/CBRAM may be strongly temperature dependent, a resistive switching mechanism in a ReRAM/CBRAM may also be highly temperature dependent. Additionally, these systems may operate stochastically as the formation and movement of the filament is stochastic. Other types of ReRAM/CBRAM may also exhibit unstable qualities. Further, resistance switching in ReRAM/CBRAMs tends to fatigue over many memory cycles. That is, after a memory state is changed many times, a difference in resistance between a conducting state and an insulative state may change significantly. In a commercial memory device, such a change may take the memory out of specification and make it unusable.

Given an inherent difficulty in forming a thin film resistance switching material that is stable over time and temperature, a workable resistance switching memory remains a challenge. Furthermore, all resistance switching mechanisms developed up to now have been inherently unsuitable for memories, due to high currents, electroforming, no measurable memory read or write windows over a reasonable range of temperatures and voltages, and many other problems such as stochastic behavior. Thus, there remains a need in the art for a non-volatile memory that is deterministic has low power, high speed, high density and stability, and in particular, such a memory that is scalable to feature sizes well below 65 nanometers (nm).

DETAILED DESCRIPTION

Figure 1A:
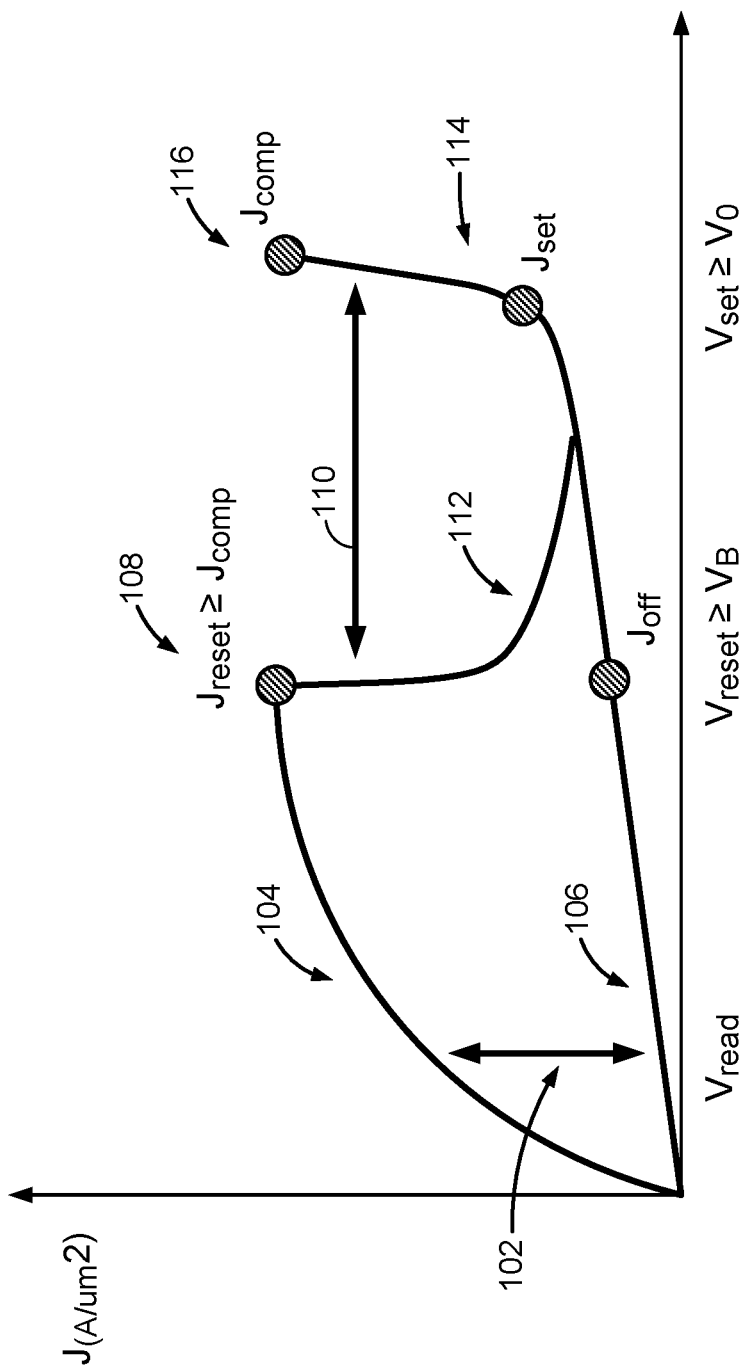
FIG. 1A shows a plot of current density versus voltage for a CES device according to an embodiment.

Systems and devices typically implement circuits that are capable of temporarily storing and outputting signal values such as flip-flop or latch circuits. These devices may be used, for example, to synchronize different portions of a circuit which are controlled by a common clock signal, for example. A flip-flop or a latch may comprise a memory element (e.g., RAM element or capacitor, etc.) capable of repeatedly storing a state based, at least in part, on an data value of an input signal, and outputting a current state on alternating cycles. For example, operations to store a state and output the stored state may alternate such that an output operation may provide an output signal based on a preceding input operation. A subsequent input operation may immediately follow the output operation to store a new state.

Flip-flop or latch circuits typically employ volatile memory elements to store a state. As such, a flip-flop or latch circuits typically lose their state if power is removed from a device incorporating these circuits. Accordingly, devices experiencing a power interruption typically employ lengthy processes to restore a device state as power is restored since the states of flip-flop or latch circuits prior to power interrupts are lost. Attempts to employ non-volatile memory elements in a flip-flop or latch circuit have typically not been commercially feasible since many previous non-volatile memory technologies are not sufficiently durable given the repetitive storage and retrieval of states in a flip-flop or latch circuit.

In one particular implementation, a device may be used to store a first symbol or value in a first mode wherein at least a first non-volatile memory element is in a first impedance state and at least a second non-volatile memory elements is in a second impedance state, and store a second symbol or value in a second mode wherein at least the second of the non-volatile memory elements is in the first impedance state and at least the first non-volatile memory element is in the second impedance state. The device may further comprise: an input circuit to place the plurality of non-volatile memory elements in the first mode or the second mode based, at least in part, on a data value of an input signal; and an output circuit to generate an output signal based, at least in part, on a current mode of the plurality of non-volatile memory elements and synchronized with the input signal.

Particular aspects of the present disclosure incorporate a Correlated Electron Material (CEM) to form a correlated electron switch (CES) for implementation of a non-volatile memory element. In this context, a CES may exhibit an abrupt conductor/insulator transition arising from electron correlations rather than solid state structural phase changes (e.g., crystalline/amorphous in phase change memory (PCM) devices or filamentary formation and conduction in resistive RAM devices as discussed above). In particular implementations, this may allow a CES to have durability that surpass previous non-volatile memory technologies. In one aspect, an abrupt conductor/insulator transition in a CES may be responsive to a quantum mechanical phenomenon, in contrast to melting/solidification or filament formation. Such a quantum mechanical transition between conductive and insulative states in a CEM memory device may be understood in any one of several aspects.

In one aspect, a quantum mechanical transition of a CES between an insulative state and a conductive state may be understood in terms of a Mott transition. In a Mott transition, a material may switch from an insulative state to conductive state if a Mott transition condition occurs. The criteria may be defined by the condition $(n_c)^{1/3} a = 0.26$, where $n_c$ is a concentration of electrons and "a" is a Bohr radius. If a critical carrier concentration is achieved such that the Mott criteria is met, a Mott transition may occur and state may change from a high resistance/capacitance to a low resistance/capacitance.

In one aspect, a Mott transition may be controlled by a localization of electrons. As carriers are localized, a strong coulomb interaction between electrons splits the bands of the material creating an insulator. If electrons are no longer localized, a weak coulomb interaction may dominate band splitting, leaving behind a metal (conductive) band. This is sometimes explained as a "crowded elevator" phenomenon. While an elevator has only a few people in it, the people can move around easily, which is analogous to a conducting state. While the elevator reaches a certain concentration of people, on the other hand, passengers can no longer move, which is analogous to the insulative state. However, it should be understood that this classical explanation provided for illustrative purposes, like all classical explanations of quantum phenomenon, is only an incomplete analogy, and that claimed subject matter is not limited in this respect.

In particular implementations of aspects of this disclosure, a resistive switching integrated circuit memory may comprise: a resistive switching memory cell including a CES device; a write circuit for placing the resistive switching memory cell in a first resistive state or a second resistive state depending on signals provided to the memory device, wherein a resistance of a CES is higher in the second resistance state than in the first resistance state; and a read circuit for sensing the state of the memory cell and providing an electrical signal corresponding to the sensed state of the memory cell. In one aspect, a resistance of a CES in the second memory cell state may be more than 100 times the resistance in the second memory cell state. In a particular implementation, a CES device may switch resistive states responsive to a Mott-transition in the majority of the volume of the CES device. In one aspect, a CES device may comprise a material selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

In a particular embodiment, a CES device may be formed as a "CEM random access memory (CeRAM)" device. In this context, a CeRAM device comprises a material that may transition between or among a plurality of predetermined detectable memory states based, at least in part, on a transition of at least a portion of the material between a conductive state and an insulative state utilizing the quantum mechanical Mott transition. In this context, a "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive state and insulative memory states. As discussed in the particular example implementations below, material of a CES element sandwiched between conductive terminals may be placed in an insulative or high impedance memory state by application of a first programming signal across the terminals having a voltage $V_{reset}$ and current $I_{reset}$, or placed in a conductive or low impedance memory state by application of a second programming signal across the terminals having a voltage $V_{set}$ and current $I_{set}$. In this context, it should be understood that terms such as "conductive or low impedance" memory state and "insulative or high impedance" memory state are relative terms and not specific to any particular quantity or value for impedance or conductance. For example, while a memory device is in a first memory state referred to as an insulative or high impedance memory state the memory device in one aspect is less conductive (or more insulative) than while the memory device in a second memory state referred to as a conductive or low impedance memory state.

In a particular implementation, CeRAM memory cells may comprise a metal/CEM/metal (M/CEM/M) stack formed on a semiconductor. Such an M/CEM/M stack may be formed on a diode, for example. In an example, implementation, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1A shows a plot of current density versus voltage across terminals (not shown) for a CES device according to an embodiment. Based, at least in part, on a voltage applied to terminals of the CES device (e.g., in a write operation), the CES may be placed in a conductive state or an insulative state. For example application of a voltage $V_{set}$ and current density $J_{set}$ may place the CES device in a conductive memory state and application of a voltage $V_{reset}$ and a current density $J_{reset}$ may place the CES device in an insulative memory state. Following placement of the CES in an insulative state or conductive state, the particular state of the CES device may be detected by application of a voltage $V_{read}$ (e.g., in a read operation) and detection of a current or current density at terminals of the CES device.

According to an embodiment, the CES device of FIG. 1A may be formed from a variable resistance material that switches from a first resistive state to a second resistive state, with the second resistive state having a resistance at least ten times higher than the first resistance state, and the change in resistance being primarily arising from electron localization as discussed above. In particular implementations, variable resistance materials of a CES device may include any TMO, such as, for example, perovskites, Mott insulators, charge exchange insulators, and Anderson disorder insulators. In particular implementations, a CES device may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES device may be prepared without electroforming. Other implementations may employ other transition metal compounds without deviating from claimed subject matter. For example, $\{M(chxn)_2Br\}Br_2$ where M may comprise Pt, Pd, or Ni, and chxn comprises 1R,2R-cyclohexanediamine, and other such metal complexes may be used without deviating from claimed subject matter.

In one aspect, the CES device of FIG. 1A may comprise materials that are TMO metal oxide variable resistance materials, though it should be understood that these are exemplary only, and are not intended to limit claimed subject matter. Particular implementations may employ other variable resistance materials as well. Nickel oxide, NiO, is disclosed as one particular TMO. NiO materials discussed herein may be doped with extrinsic ligands, which may stabilize variable resistance properties. In particular, NiO variable resistance materials disclosed herein may include a carbon containing ligand, which may be indicated by $NiO(C_x)$. Here, one skilled in the art may determine a value of x for any specific carbon containing ligand and any specific combination of carbon containing ligand with NiO simply by balancing valences. In another particular example, NiO doped with extrinsic ligands may be expressed as $NiO(L_x)$, where $L_x$ is a ligand element or compound and x indicates a number of units of the ligand for one unit of NiO. One skilled in the art may determine a value of x for any specific ligand and any specific combination of ligand with NiO or any other transition metal simply by balancing valences.

If sufficient bias is applied (e.g., exceeding a band-splitting potential) and the aforementioned Mott condition is met (injected electron holes=the electrons in a switching region), the CES device may rapidly switch from a conductive state to an insulator state via the Mott transition. This may occur at point 108 of the plot in FIG. 1A. At this point, electrons are no longer screened and become localized. This correlation may result in a strong electron-electron interaction potential which splits the bands to form an insulator. While the CES device is still in the insulative state, current may generated by transportation of electron holes. If enough bias is applied across terminals of the CES, electrons may be injected into a metal-insulator-metal (MIM) diode over the potential barrier of the MIM device. If enough electrons have been injected and enough potential is applied across terminals to place the CES device in a set state, an increase in electrons may screen electrons and remove a localization of electrons, which may collapse the band-splitting potential forming a metal.

According to an embodiment, current in a CES device may be controlled by an externally applied "compliance" condition determined based, at least in part, on the external current limited during a write operation a write operation to place the CES device in an insulative state. This externally applied compliance current may also set a condition of a current density for a subsequent reset operation to place the CES in a conductive state. As shown in the particular implementation of FIG. 1A, a current density $J_{comp}$ applied during a write operation at point 116 to place the CES device in an insulative state may determine a compliance condition for placing the CES device in a conductive state in a subsequent write operation. As shown, the CES device may be subsequently placed in a conductive state by application of a current density $J_{reset} \geq J_{comp}$ at a voltage $V_{reset}$ at point 108, where $J_{comp}$ is externally applied.

The compliance therefore may set a number of electrons in a CES device which are to be "captured" by holes for the Mott transition. In other words, a current applied in a write operation to place a CES device in a conductive memory state may determine a number of holes to be injected to the CES device for subsequently transitioning the CES device to an insulative memory state.

As pointed out above, a reset condition may occur in response to a Mott transition at point 108. As pointed out above, such a Mott transition may occur at condition in a CES device in which a concentration of electrons n equals a concentration of electron holes p. This condition may be modeled according to expression (1) as follows:

$$\lambda_{TF} n^{\frac{1}{3}} = C \sim 0.26 \quad (1)$$
$$n = \left(\frac{C}{\lambda_{TF}}\right)^3$$

where:
$\lambda_{TF}$ is a Thomas Fermi screening length; and
C is a constant.

According to an embodiment, a current or current density in a region 104 of the plot shown in FIG. 1A may exist in response to injection of holes from a voltage signal applied across terminals of a CES device. Here, injection of holes may meet a Mott transition criterion for the conductive state to insulative state transition at current $I_{MI}$ as a critical voltage $V_{MI}$ is applied across terminals of CES device. This may be modeled according to expression (2) as follows:

$$I_{MI}(V_{MI}) = \frac{dQ(V_{MI})}{dt} \approx \frac{Q(V_{MI})}{t} \quad (2)$$
$$Q(V_{MI}) = qn(V_{MI})$$

Where $Q(V_{MI})$ is the charged injected (hole or electron) and is a function of an applied voltage.

Injection of electron holes to enable a Mott transition may occur between bands and in response to critical voltage $V_{MI}$ and critical current $I_{MI}$. By equating electron concentration n with a charge concentration to bring about a Mott transition by holes injected by $I_{MI}$ in expression (2) according to expression (1), a dependency of such a critical voltage $V_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$
$$J_{reset}(V_{MI}) = J_{MI}(V_{MI}) = \frac{I_{MI}(V_{MI})}{A_{CeRam}} = \frac{q}{A_{CeRam}t}\left(\frac{C}{\lambda_{TF}(V_{MI})}\right)^3$$

Where:
$A_{CeRam}$ is a cross-sectional area of a CES element; and
$J_{reset}(V_{MI})$ is a current density through the CES element to be applied to the CES element at a critical voltage $V_{MI}$ to place the CES element in an insulative state.

According to an embodiment, a CES element may be placed in a conductive memory state (e.g., by transitioning from an insulative memory state) by injection of a sufficient number of electrons to satisfy a Mott transition criteria.

In transitioning a CES to a conductive memory state, as enough electrons have been injected and the potential across terminal of the CES device overcomes a critical switching potential (e.g., $V_{set}$), injected electrons begin to screen and unlocalize double-occupied electrons to reverse a disproportion reaction and closing the bandgap. A current density $J_{set}(V_{MI})$ for transitioning the CES to the conductive memory state at a critical voltage $V_{MI}$ enabling transition to the conductive memory state may be expressed according to expression (4) as follows:

$$I_{IM}(V_{IM}) = \frac{dQ(V_{IM})}{dt} \approx \frac{Q(V_{IM})}{t} \quad (4)$$
$$Q(V_{IM}) = qn(V_{IM})$$
$$I_{IM}(V_{IM}) = \frac{Q(V_{IM})}{t} = \frac{qn(V_{IM})}{t} = \frac{q}{t}\left(\frac{C}{a_B}\right)^3$$
$$J_{set}(V_{IM}) = J_{injection}(V_{IM}) = J_{IM}(V_{IM}) = \frac{I_{IM}(V_{IM})}{A_{CeRam}} = \frac{q}{A_{CeRam}t}\left(\frac{C}{a_B}\right)^3$$

where:
$a_B$ is a Bohr radius.

According to an embodiment, a "read window" 102 for detecting a memory state of a CES device in a read operation may be set out as a difference between a portion 106 the plot of FIG. 1A while the CES device is in an insulative state and a portion 104 of the plot FIG. 1A while the CES device is in a conductive state at a read voltage $V_{read}$. In a particular implementation, read window 102 may be used to determine a Thomas Fermi screening length $\lambda_{TF}$ of material making up the CES device. For example, at a voltage $V_{reset}$, current densities $J_{reset}$ and $J_{set}$ may be related to according to expression (5) as follows:

$$\lambda_{TF}(@V_{reset}) = a_B\left(\frac{J_{reset}}{J_{off}}\right)^{\frac{1}{3}} \quad (5)$$

In another embodiment, a "write window" 110 for placing a CES device in an insulative or conductive memory state in a write operation may be set out as a difference between $V_{reset}$ (at $J_{reset}$) and $V_{set}$ (at $J_{set}$). Establishing $|V_{set}|>|V_{reset}|$ enables a switch between conductive and insulative state. $V_{reset}$ may be approximately at a band splitting potential arising from correlation and $V_{set}$ may be approximately twice the band splitting potential. In particular implementations, a size of write window 110 may be determined, at least in part, by materials and doping of the CES device.

Figure 1B:
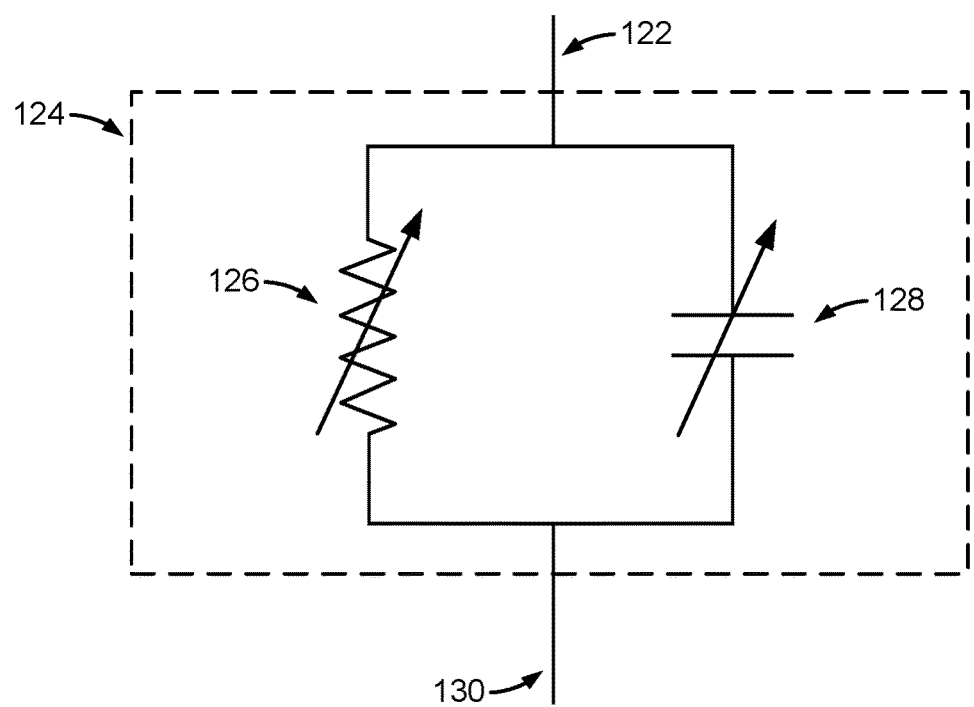
FIG. 1B is a schematic diagram of an equivalent circuit to a CES device according to an embodiment.

The transition from high resistance/capacitance to low resistance/capacitance in a CES device may be represented by a singular impedance of the CES device. FIG. 1B depicts a schematic diagram of an equivalent circuit of an example variable impeder device (such as a CES device), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Of course, although a variable resistor 126 and variable capacitor 128 are depicted in FIG. 1B as comprising discrete components, a variable impeder device, such as variable impeder device 124, may comprise a substantially homogenous CEM, wherein the CEM comprises characteristics of variable capacitance and variable resistance. Table 1 below depicts an example truth table for an example variable impeder device, such as variable impeder device 100.

TABLE 1

| Resistance | Capacitance | Impedance |
| --- | --- | --- |
| $R_{high}$ ($V_{applied}$) | $C_{high}$ ($V_{applied}$) | $Z_{high}$ ($V_{applied}$) |
| $R_{low}$ ($V_{applied}$) | $C_{low}$ ($V_{applied}$)~0 | $Z_{low}$ ($V_{applied}$) |

Particular implementations discussed below are directed to a device comprising one or more memory elements (e.g., non-volatile memory elements) such as a CES device, for example. According to an embodiment, a memory element may be placed in a particular memory state (e.g., a conductive or low impedance memory state, or an insulative or high impedance memory state) by independently controlling voltage and current applied across terminals of the memory element in a "write operation." As discussed below in particular implementations, such a write operation may be executed by application of a signal which is controlled to provide a critical current and voltage across terminals of the memory device to place the memory device in a particular memory state. In another aspect, a memory state of a memory element may be detected or sensed in a "read operation." In one aspect of a read cycle, to detect a current memory state of a memory element, a voltage of a signal applied across terminals of the memory element may be controlled so as to not detectably alter a current memory state of the memory element.

As pointed out above in FIG. 1A, a memory state of a CES device may be changed or determined based on a particular voltage and current. For example, applying a programming signal having a voltage $V_{reset}$ and a sufficient current $I_{reset}$ may place a CES device in an insulative or high impedance memory state. Likewise, applying a programming signal having a voltage $V_{set}$ and a sufficient current $I_{set}$ may place a CES device in a conductive or low impedance memory state. As may be observed from FIG. 1A, that while a magnitude of voltage $V_{set}$ is greater than a magnitude of voltage $V_{reset}$, a magnitude of current $I_{set}$ is lower than a magnitude of current $I_{reset}$.

In particular, a write operation is described as a particular process of placing a memory device such as a CES element in a particular memory state of a plurality of predetermined memory states by applying a "programming signal" to terminals of the memory device. Particular ones of the predetermined memory states may correspond to particular voltage levels to be applied to the memory device (e.g., $V_{set}$ and $V_{reset}$). Similarly, particular ones of the predetermined memory states may correspond to particular current levels to be applied to the memory device (e.g., $I_{set}$ and $I_{reset}$). Accordingly, in a particular embodiment, a programming signal to place a memory device in a particular memory state in a write operation may be controlled to have a particular voltage level and current level corresponding to the particular memory state.

As described in a particular implementation below, a voltage signal having a voltage level for a programming signal to place a memory device in a predetermined memory state. Conducting elements may selectively connect a voltage signal to or disconnect a voltage signal from the memory device at a current level corresponding to the predetermined memory state based, at least in part, on the data signal. In this context, a "conducting element" comprises a circuit element capable of permitting current to pass between two nodes. In a particular implementation, a conducting element may vary a current permitted to pass between nodes based, at least in part, on a particular condition. The particular implementations described below employ FETs as conducting elements to permit current to pass between source and drain terminals based, at least in part, on a voltage applied to a gate terminal. It should be understood, however, that other types of devices such as, a bipolar transistor, diode, variable resistor, etc. may be used as a conducting element, and that claimed subject matter is not limited this respect. In this context, a conducting element having first and second terminals may "connect" the first and second terminals by providing a conductive path between the first and second terminals having a very small or negligible impedance for a particular signal. In one particular example implementation, a conductive element may vary an impedance between the first and second terminals based, at least in part, on a signal provided to a third terminal of the conductive element (e.g., a based on a voltage or current applied to the third terminal). In one aspect, a conductive element may "close" to thereby connect first and second terminals in response to a signal provided on the third terminal. Likewise, a conductive element may "open" to thereby disconnect first and second terminals in response to a different signal provide on the third terminal. In one aspect, a conductive element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal.

Figure 2:
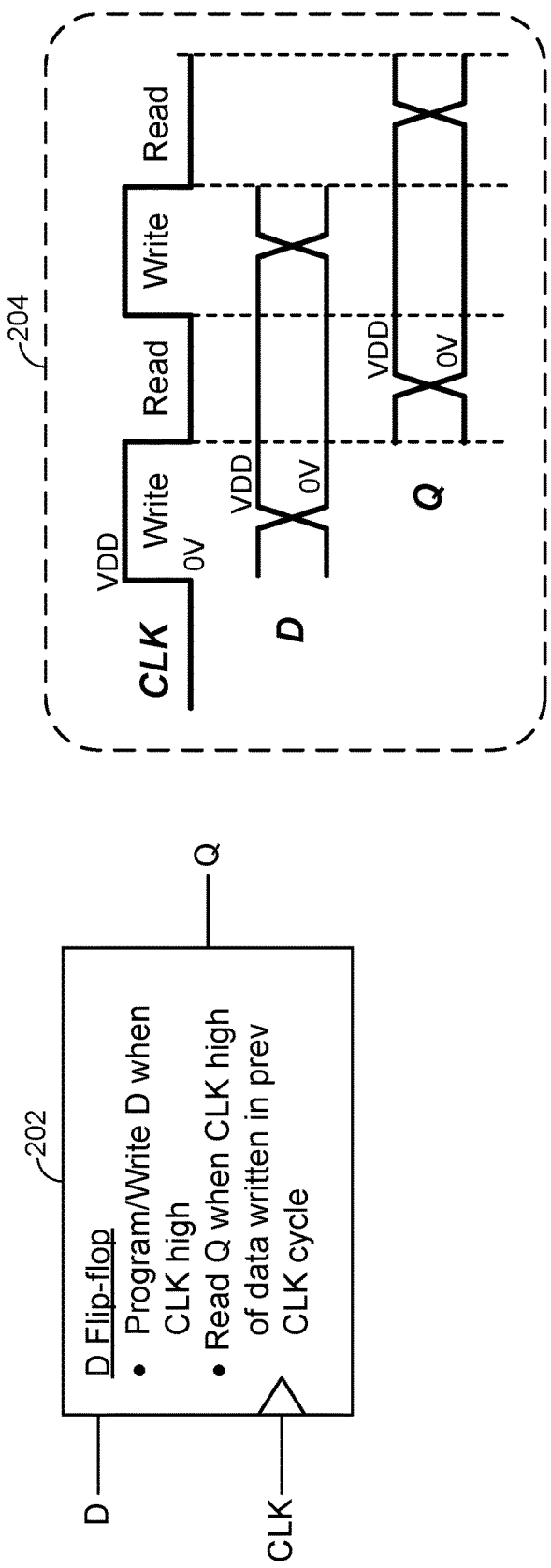
FIG. 2 is a schematic diagram of a device according to particular embodiments.

FIG. 2 is a schematic diagram of a device 202 for storing a state based, at least in part, on a value of a data signal D on write cycles, and generating an output signal Q on read cycles. As described below, device 202 may comprise non-volatile memory elements to store a symbol or value based on the value of the data signal D. Output signal Q provided on read cycles is based on a current state of the non-volatile memory elements, which is determined by a preceding write operation. As discussed below, generation of output signal Q in read cycles is synchronized with storing symbols or values to the non-volatile memory elements on write cycles based on a voltage signal CLK that alternates between 0.0V in read operations and VDD during write operations.

According to an embodiment, device 202 may perform write cycles and read cycles in an alternating fashion as controlled by voltage signal CLK shown in timing diagram 204. Here, a read cycle generates an output signal based on a current mode of non-volatile memory elements where the current mode of the non-volatile memory elements is determined at a write cycle preceding the read cycle. Following the read cycle, a subsequent write operation may then place the non-volatile memory elements in a subsequent mode based on a data value of input signal D.

Figure 3:
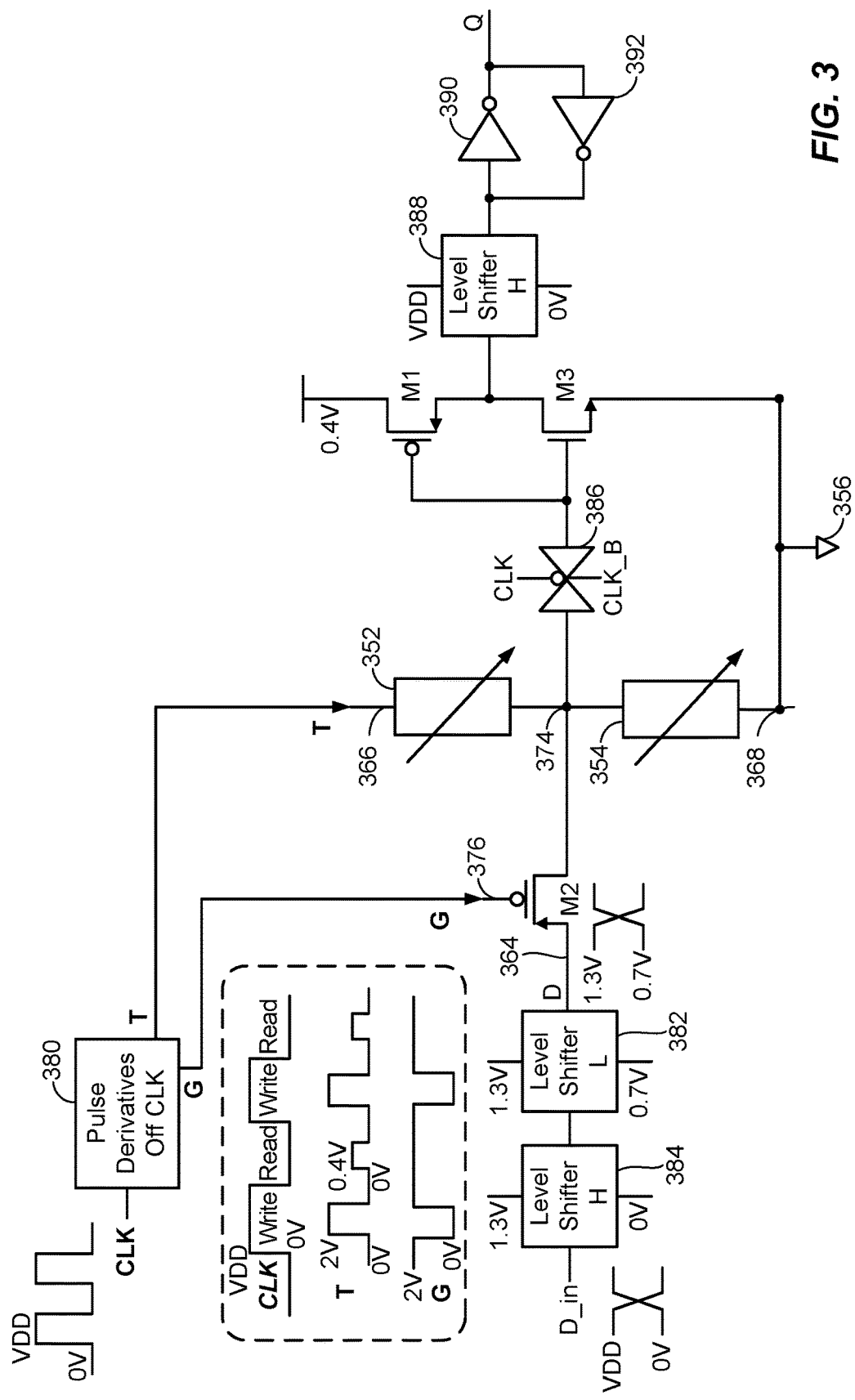
FIG. 3 is a schematic diagram of a device according to particular embodiments.

FIG. 3 is a schematic diagram of an architecture for a device to store a symbol or value to non-volatile memory devices based on an input signal on write cycles, and generate an output signal based on a current state of the non-volatile memory devices in read cycles according to particular embodiments. Non-volatile memory (NVM) elements 352 and 354 are connected in series at a node 374 between nodes 366 and 368. NVM elements 352 and 354 may be placed in complementary states to represent one of two distinct symbols or values (e.g., "1" or "0," true or false, etc.). To store a first symbol or value in a first mode, NVM element 352 may be placed in a conductive or low impedance memory state while NVM element 354 may be placed in an insulative or high impedance memory state. Similarly, to store a second symbol or value in a second mode, NVM element 352 may be placed in the insulative or high impedance memory state while NVM element 354 may be placed in the conductive or low impedance memory state. Particular examples below are directed to implementations of NVM elements 352 and 354 as CES devices or CeRAM devices. It should be understood, however, that these are merely non-limiting examples of devices that may be used, and that claimed subject matter is not limited in this respect.

As pointed out above, a "non-volatile memory" comprises an integrated circuit device in which a memory cell or element maintains its memory state (e.g., a conductive or low impedance memory state, or an insulative or high impedance memory state) after power supplied to the device is removed. As used herein, the term "reference node" refers to a node in a circuit that is maintained at a particular voltage level or at a particular voltage difference from another node in the circuit. In one example, a reference node may comprise or be connected to a ground node. In other particular implementations, a reference node may be maintained at a particular voltage relative to that of a ground node.

An output circuit may generate an output signal Q based on a current state of NVM elements 352 and 354 (e.g., symbol or value stored to NVM elements 352 and 354 in a preceding write cycle), which is detected during read cycles alternating with write cycles. In a read operation, a value of a periodic voltage signal G applied to a gate of FET M2 is high to disconnect an input signal from node 374. Also during a read operation a periodic voltage signal T applied to node 366 maintains a particular voltage (e.g., 0.4V) between nodes 366 and 368. It may be observed that the series coupling of NVM elements 352 and 354 between the set voltage maintained between nodes 366 and 368 may behave as a voltage divider. An output circuit comprising a transmission gate 386 may connect in response to a voltage of periodic signal CLK being low during a read cycle.

An output circuit may further comprise transmission gate 386, and FETs M1 and M3 forming an inverter to sample a voltage at node 374 on read cycles. If the first value or symbol is being stored (where NVM element 352 is in the conductive or low impedance memory state and NVM element 354 is the insulative or high impedance memory state), a voltage at node 374 connected through transmission gate 386 and applied to gates of FETs M1 and M3 may be sufficiently high to close FET M3 and open FET M1, connecting an input terminal of a level shifter 388 to reference node 356 (e.g., ground). Similarly, if the second value or symbol is being stored (where NVM element 352 is in the insulative or high impedance memory state and NVM element 354 is the conductive or low impedance memory state), a voltage at node 374 connected through transmission gate 386 and applied to gates of FETs M1 and M3 may be sufficiently low to open FET M3 and close FET M1, connecting the input terminal of a level shifter 388 to a voltage source at 0.4 V.

During a read operation, level shifter 388 may provide a voltage signal at an output terminal of 0.0V (e.g., if FET M3 is closed and FET M1 is open responsive to a high voltage at node 374) or VDD (e.g., if FET M3 is open and FET M1 is closed responsive to a low voltage at node 374). Inverters 390 and 392 in a feedback configuration may maintain a voltage of output signal Q based on the voltage signal at the output terminal of level shifter 388.

It should be observed that by applying a voltage at node 366 during a read cycle, a magnitude of a read current $I_{read}$ between nodes 366 and 374, or between nodes 368 and 374 may be easily controlled so as to not affect a current memory state of NVM element 352 or 354 (and avoid a reset event while in a conductive or high impedance memory state). This may allow for high speed operation and allow for opportunities to further optimize for variability, endurance, standby leakage during active mode, density, ease of integration with a CMOS device, just to provide a few examples.

According to an embodiment, an input circuit comprising FET M2 and level shifters 382 and 384 may store a symbol or value to NVM elements 352 and 354 in write cycles as controlled by periodic voltage signals G and T. During a write cycle, a low voltage for periodic voltage signal CLK may open transmission gate 386 to disconnect node 374 from the output circuit. Level shifters 382 and 384 map a voltage of input signal D (e.g., having a voltage of VDD or 0.0V) to either 0.7V or 1.3V depending a value of input signal D. A low voltage level of periodic voltage signal G applied to a gate of FET M2 during write cycles may set a voltage of node 374 at either 1.3V or 0.7V depending on a value of input signal D while a voltage between nodes 368 and 366 is maintained at a particular voltage (e.g., $V_{set}+V_{reset}$ or 4.0V). If node 374 is set at 1.3 V in a write cycle (e.g., input signal D has a first data value), a first programming signal applied across terminals of NVM element 354 may provide a voltage $V_{set}$ and current $I_{reset}$ to place NVM element 354 in a conductive or low impedance state, and a second programming signal applied across terminals of NVM element 352 may provide a voltage $V_{reset}$ and current $I_{reset}$ to place NVM element 352 in an insulative or high impedance state. Likewise, if node 374 is set at 0.7V in a write cycle (e.g., input signal D has a second data value), a third programming signal applied across terminals of NVM element 354 may provide a voltage $V_{reset}$ and current $I_{reset}$ to place NVM element 354 in an insulative or high impedance state, and a fourth programming signal applied across terminals of NVM element 352 may provide a voltage $V_{set}$ and current $I_{set}$ to place NVM element 352 in a conductive or low impedance state. Also, current sourced at nodes 366 and 368 may be controlled to provide current $I_{set}$ across NVM element 352 and current $I_{reset}$ across NVM element 354 in a first write cycle to place NVM elements 352 and 354 in a first mode, and provide current $I_{reset}$ across NVM element 352 and current $I_{set}$ across NVM element 354 in a complementary second write cycle to place NVM elements 353 and 354 in a second mode.

At the end of a read or write cycle, periodic voltage signal T applied to node 366 may return to 0.0V (e.g., from 0.4V in a read cycle or $V_{set}+V_{reset}$ in a write cycle). This may allow charge stored in the internal capacitance of NVM elements 352 and 354 to discharge through internal resistance for preparing NVM elements 352 and 354 for a subsequent access, and for permitting faster access times for a subsequent read or write cycle. Applying a single voltage for read cycles and a single voltage for write cycles at node 366 may avoid voltage access complexity of supporting multiple voltage levels for memory element access in other memory cell implementations.

According to an embodiment, the particular implementation of a device in FIG. 3 may be scalable to incorporate multiple like devices such as in a byte-wide or word-wide serial input/output device. In one implementation, clock circuit 380 may be shared among multiple devices for storing a value of an input on write cycles and generating an output signal on read cycles based on a state of NVM elements as discussed above. Also, aspects of level shifters 382 and 384 may be shared between or among fan-outs of input signal D.

In a particular implementation, the NVM elements 352 and 354 may comprise CES or CeRAM elements having one or more properties discussed above with reference to FIG. 1A in that $|V_{reset}|<|V_{set}|$ while $|I_{reset}|>|I_{set}|$. Accordingly, in either of the aforementioned write operations, a magnitude of a write voltage in a programming signal to place either NVM element 352 or 354 in a conductive or low impedance memory state may be greater than a magnitude of a write voltage of a programming signal to place either NVM element 352 or 354 in an insulative or high impedance memory state. Also, a magnitude of a write current in a programming signal to place either NVM element 352 or 354 in a conductive or low impedance memory state may be less than a magnitude of a write current of a programming signal to place either NVM element 352 or 354 in an insulative or high impedance memory state.

The second write voltage, and a magnitude of the first write current may be less than a magnitude of the second write current. Following placement of an NVM element (e.g., NVM element 352 or 354) in the second memory state in a write cycle, a third voltage (e.g., $V_{read}$) may be applied across the terminals of the NVM element in a read cycle to detect a current memory state of the NVM element. While the third voltage is being applied during the read operation, a current between the first and terminals may be limited to less than a magnitude of the first current (e.g., $|I_{read}|<|I_{reset}|$) to maintain the second memory state of the NVM element (e.g., conductive or low impedance memory state).

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. A device comprising:
    a plurality of non-volatile memory elements connected in series, the plurality of non-volatile memory elements being operable to:
        store a first symbol or value in a first mode or store a second symbol or value in a second mode, the first and second modes being based, at least in part, on impedance states of at least two of the plurality of non-volatile memory elements;
    the device further comprising:
    an input circuit to place the plurality of non-volatile memory elements in the first mode or the second mode on write cycles based, at least in part, on a data value of an input signal; and
    an output circuit to generate an output signal on read cycles based, at least in part, on a current mode of the plurality of non-volatile memory elements, the read cycles being synchronized with the write cycles according to a common clock signal,
    wherein the write cycles and read cycles are interleaved and alternate, and
    wherein a value of the output signal generated on a read cycle is based on a data value of an input signal in a write cycle that immediately precedes the read cycle.

2. The device of claim 1, wherein the input circuit comprises:
    a conducting element to apply a voltage based on a data signal to a first terminal of a first non-volatile memory element of the plurality of non-volatile memory elements and a first terminal of a second non-volatile memory element of the plurality of non-volatile memory elements in response to a first periodic voltage signal.

3. The device of claim 2, wherein a second terminal of the first non-volatile memory element is configured to receive a second periodic voltage signal and a second terminal of the second non-volatile memory element is connected to a reference node.

4. The device of claim 1, wherein the output circuit further comprises:
    a conducting element to sample a voltage at a first terminal of a first non-volatile memory device of the plurality of non-volatile memory elements and a first terminal of a second non-volatile memory device of the plurality of non-volatile memory elements in response to a first periodic voltage signal, wherein a value of the output signal is based, at least in part, on the sampled voltage.

5. The device of claim 4, wherein the voltage at the first terminal of the first non-volatile memory device and the first terminal of the second non-volatile memory device is sampled while a read voltage is applied to a second terminal of the first non-volatile memory device from a second periodic voltage signal.

6. The device of claim 1, wherein the input circuit comprises a conducting element to apply a voltage to a first terminal of a first non-volatile memory element of the plurality of non-volatile memory elements and a first terminal of a second non-volatile memory element of the plurality of non-volatile memory elements during the write cycles based, at least in part, on the data value, the conducting element to further apply, at least in part, a first programming signal across the first terminal of the first non-volatile memory element and a second terminal of the first non-volatile memory element and apply, at least in part, a second programming signal across the first terminal of the second non-volatile memory element and a second terminal of the second non-volatile memory element during the write cycles.

7. The device of claim 6, wherein the first programming signal comprises a first voltage and a first current and wherein the second programming signal comprises a second voltage and a second current, and wherein:
a magnitude of the first voltage exceeds a magnitude of the second voltage and a magnitude of the second current exceeds a magnitude of the first current to place the plurality of non-volatile memory elements in the first mode; and
the magnitude of the second voltage exceeds the magnitude of the first voltage and the magnitude of the first current exceeds the magnitude of the second current to place the plurality of non-volatile memory elements in the second mode.

8. The device of claim 1, wherein a first non-volatile memory element of the plurality of non-volatile memory elements comprises a first correlated electron switch (CES) element and a second non-volatile memory element of the plurality of non-volatile memory elements comprises a second CES element.

9. The device of claim 1, wherein a first non-volatile memory element of the plurality of non-volatile memory elements comprises a first correlated electron random access memory (CeRAM) element and a second non-volatile memory element of the plurality of non-volatile memory elements comprises a second CeRAM element.

10. A method comprising:
placing a plurality of non-volatile memory elements connected in series in a first mode or a second mode on write cycles based, at least in part, on a data value of an input signal, wherein the first mode and the second mode are based, at least in part, on impedance states of at least two of the plurality of non-volatile memory elements; and
generating an output signal based, at least in part, on a current mode of the plurality of non-volatile memory elements on read cycles synchronized with the write cycles according to a common clock signal,
wherein the read cycles and write cycles alternate and are interleaved,
and wherein a value of the output signal generated on a read cycle comprises a data value of an input signal in a write cycle that immediately precedes the read cycle.

11. The method of claim 10, and further comprising placing the plurality of non-volatile memory elements in the first mode in a write cycle by:
applying a first programming signal across terminals of a first non-volatile memory element of the plurality of non-volatile memory elements to place the first non-volatile memory element in a first impedance state; and
applying a second programming signal across terminals of a second non-volatile memory element of the plurality of non-volatile memory elements to place the second non-volatile memory element in a second impedance state.

12. The method of claim 11, wherein a magnitude of a first write current of the first programming signal is greater than a magnitude of a second write current of the second programming signal, and wherein a magnitude of a first write voltage of the first programming signal is less than a magnitude of a second write voltage of the second programming signal.

13. The method of claim 10, wherein a first non-volatile memory element of the plurality of non-volatile memory elements comprises a first correlated electron random access memory (CeRAM) element and a second non-volatile memory element of the plurality of non-volatile memory elements comprises a second CeRAM element.

14. The method of claim 10, wherein a first non-volatile memory element of the plurality of non-volatile memory elements comprises a first correlated electron switch (CES) element and a second non-volatile memory element of the plurality of non-volatile memory elements comprises a second CES element.

15. The method of claim 10, wherein a first terminal of a first non-volatile memory element of the plurality of non-volatile memory elements and a first terminal of a second non-volatile memory element of the plurality of non-volatile memory elements are connected at a node, and wherein generating the output signal further comprises:
maintaining a set voltage between a second terminal of the first non-volatile memory element and a second terminal of the second non-volatile memory element.

16. The method of claim 15, wherein generating the output signal further comprises:
sampling a voltage at the node; and
generating the output signal based, at least in part, on the sampled voltage.

17. The method of claim 16, wherein generating the output signal further comprises selectively connecting an input terminal of a level shifter to a first voltage or a second voltage based, at least in part, on the sampled voltage.

18. The device of claim 8, wherein the first and second CES elements comprise a correlated electron material (CEM), and wherein an impedance state of the first CES element is based, at least in part, on a concentration of electrons in the CEM of the first CES element and an impedance state of the second CES element is based, at least in part, on a concentration of electrons in the CEM of the second CES element.

19. The method of claim 10, wherein first and second non-volatile memory elements of the plurality of non-volatile memory elements comprise a correlated electron material (CEM), and wherein an impedance state of the first non-volatile memory element is based, at least in part, on a localization of electrons in the CEM of the first non-volatile memory element and an impedance state of the second non-volatile memory element is based, at least in part, on a localization of electrons in the CEM of the second CES element.

* * * * *